United States Patent
Sundegård

[11] Patent Number: 5,834,985
[45] Date of Patent: Nov. 10, 1998

[54] DIGITAL CONTINUOUS PHASE MODULATION FOR A DDS-DRIVEN PHASE LOCKED LOOP

[75] Inventor: Bo Sundegård, Stockholm, Sweden

[73] Assignee: Telefonaktiebolaget L M Ericsson (publ), Stockholm, Sweden

[21] Appl. No.: 771,632

[22] Filed: Dec. 20, 1996

[51] Int. Cl.$^6$ .............................. H03C 3/09; H04L 27/20
[52] U.S. Cl. .................. 332/100; 332/103; 332/144; 375/274; 375/279; 375/305; 375/308
[58] Field of Search ..................... 332/100, 101, 332/102, 103, 104, 105, 127, 128, 144; 375/271, 274, 279, 302, 305, 308

[56] References Cited

U.S. PATENT DOCUMENTS

| | | | |
|---|---|---|---|
| 4,965,533 | 10/1990 | Gilmore | 331/18 |
| 5,028,887 | 7/1991 | Gilmore | 331/25 |
| 5,128,623 | 7/1992 | Gilmore | 327/107 |
| 5,291,428 | 3/1994 | Twitchell et al. | 331/18 |
| 5,374,903 | 12/1994 | Blanton | 331/4 |
| 5,425,055 | 6/1995 | Blaker | 375/279 |
| 5,481,230 | 1/1996 | Chang et al. | 332/112 |

OTHER PUBLICATIONS

*Digital Generation of Wideband LFM Waveforms* by L.O. Eber and H.H. Soule, Jr. IEEE Int.'l Radar Conference 1975, Apr. 21–23 New York pp. 170–175, XPOO2035956.

*Synchronisierte Mikrowellenoszillatoren Als Leistungsverstärker Und Frequenzteiler In Breitband–Richtfunksystemen* by B. v.Kameke, NTG Fachbericht, vol. 70, Apr. 23–25, 1980, Berlin pp. 243–249, XPOO2035871.

*Novel Measurement Schemes Serve I/Q Applications* by Radhakrishnaiah P.N. Setty Mini–Circuits, P.O. Box 350166, Brooklyn, New York 11235–0003.

Primary Examiner—Siegfried H. Grimm
Attorney, Agent, or Firm—Jenkens & Gilchrist, P.C.

[57] ABSTRACT

A system and method are provided in which a phase modulation generator is used to modulate the output signal of a DDS with a modulation index, h/N. The phase-modulated. DDS output drives a PLL, which is an upconversion stage for a radio transmitter, with the modulated DDS signal as the PLL's reference. The output of the PLL will have a modulation index of h. Consequently, the frequency band of the DDS output is significantly narrower than the frequency band of upconversion stages used in conventional transmitters, and there are significantly less spurious emissions in the transmitted signal. However, a transmitter employing the present phase-modulated DDS-driven PLL topology can still transmit over a relatively wide frequency band.

14 Claims, 5 Drawing Sheets

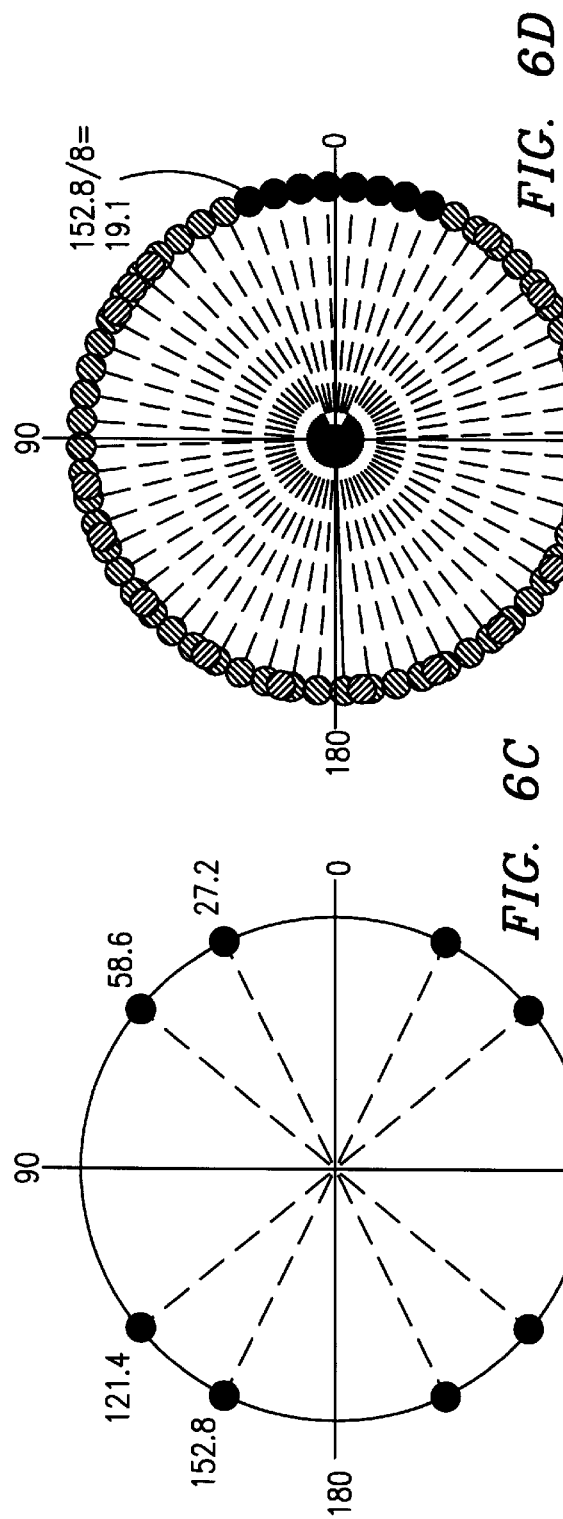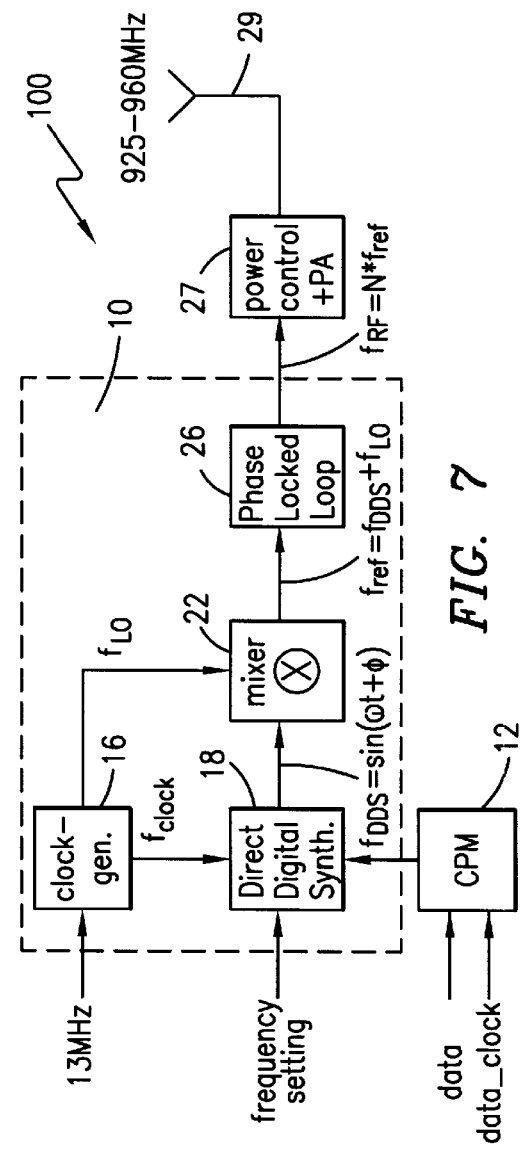

DIGITAL CONTINUOUS PHASE MODULATION FOR A DDS-DRIVEN PHASE LOCKED LOOP

BACKGROUND OF THE INVENTION

1. Technical Field of the Invention

The present invention relates generally to the radio transmitter field and, in particular, to a digital continuous phase modulator for use with a direct digital synthesizer-driven phase locked loop.

2. Description of Related Art

The aim in developing new radio transmitters is to make them smaller and cheaper to produce, while providing at least the same or better performance than prior transmitters. One way to achieve this goal is to move the digital domain closer to the transmitter's output and thereby eliminate a number of analog components. Transmitters that employ a Direct Digital Synthesizer (DDS) have been developed to achieve this goal. However, a problem that exists with the use of a DDS in an existing transmitter is that conventional modulation techniques used to upconvert the modulated intermediate frequency DDS signal to the radio frequency (RF) transmit band, are impractical for transmitters operating over wide frequency bands because of limitations imposed by the digital-to-analog converter (DAC) in the DDS.

Another problem exists with the use of a DDS-driven Phase Locked Loop (PLL) in an existing transmitter, in that no effective modulation technique has been developed for such a device. For example, U.S. Pat. No. 4,965,533 discloses a DDS-driven PLL, but with an unmodulated synthesizer. A DDS with Gaussian Minimum Shift Keying (GMSK) modulation is disclosed in U.S. Pat. No. 5,425,055, but a DDS-driven PLL is not disclosed. Nevertheless, if DDS technology is to be used in a communications system that employs fast frequency hopping and operates over relatively wide frequency bands (e.g., cellular system), the use of a DDS-driven PLL topology will be required in order for the transmitter to meet the stringent performance demands that will be placed on such a system.

SUMMARY OF THE INVENTION

It is an object of the present invention to provide a transmitter system with a phase modulated DDS-driven PLL so that the frequency band of the DDS output is significantly narrower than the frequency band of upconversion stages used in conventional transmitters. The PLL functions both as a narrow bandpass filter and a multiplier for the DDS signal.

It is another object of the present invention to provide a radio transmitter in which there are significantly less spurious emissions in the transmitted signal than in a conventional transmitter. The PLL functions as a narrow bandpass filter.

It is yet another object of the present invention to provide a radio transmitter that can transmit over a relatively wide frequency band. The PLL multiplies the DDS output bandwidth.

It is still another object of the present invention to provide a transmitter with a DDS-driven PLL in which it is possible to modulate a reference signal from the DDS, and at the same time, obtain the desired modulation index at the output of the PLL.

It is another object of the present invention to provide a radio transmitter that can perform fast frequency hopping, where the frequency hopping lock in time depends on the loop bandwidth in the PLL.

It is still another object of the present invention to provide a radio transmitter that is smaller and cheaper to produce, while providing better performance than prior transmitters.

In accordance with the present invention, the foregoing and other objects are achieved by a phase modulation generator that is used to modulate the output signal of a DDS. The phase-modulated DDS output drives a PLL, which is an upconversion stage for a radio transmitter, with the modulated DDS signal as the PLL's reference. Since the PLL, functions as a frequency multiplier, the frequency band of the DDS output is significantly narrower than the frequency band of upconversion stages used in conventional transmitters, and there are significantly less spurious emissions in the transmitted signal (the PLL also functions as a narrow bandpass filter). However, a transmitter employing the present phase-modulated DDS-driven PLL topology can still transmit over a relatively wide frequency band.

BRIEF DESCRIPTION OF THE DRAWINGS

A more complete understanding of the method and apparatus of the present invention may be had by reference to the following detailed description when taken in conjunction with the accompanying drawings wherein:

FIG. 6C is a diagram that illustrates the phase states for the transmitter of FIG. 6A.

FIG. 6D is a diagram that illustrates the phase states for the DDS-driven PLL transmitter of FIG. 6B.

FIG. 7 is a schematic block diagram of an exemplary transmitter stage that can be used to implement the apparatus and method of the present invention.

DETAILED DESCRIPTION OF THE DRAWINGS

The preferred embodiment of the present invention and its advantages are best understood by referring to FIGS. 1–8 of the drawings, like numerals being used for like and corresponding parts of the various drawings.

Essentially, in accordance with the present invention, a continuous phase modulation (CPM) generator is used to modulate the output signal of a DDS. The phase-modulated DDS output drives a PLL, which functions as an upconversion stage for a radio frequency transmitter, with the modulated DDS signal as the PLL's reference. Consequently, the frequency band of the DDS output is significantly narrower than the frequency band of upconversion stages used in conventional transmitters (e.g., without DDS-driven PLLs), and therefore, there are significantly less spurious emissions in the transmitted signal. Nevertheless, a transmitter employing the present phase-modulated DDS-driven PLL topology can still transmit over a relatively wide frequency band. Additionally, by using a CPM generator with a DDS-driven PLL in a transmitter, it is possible to modulate the (DDS) reference signal with a smaller modulation index, h/N, and still obtain the desired modulation index, h, at the output of the PLL.

Figure 1:
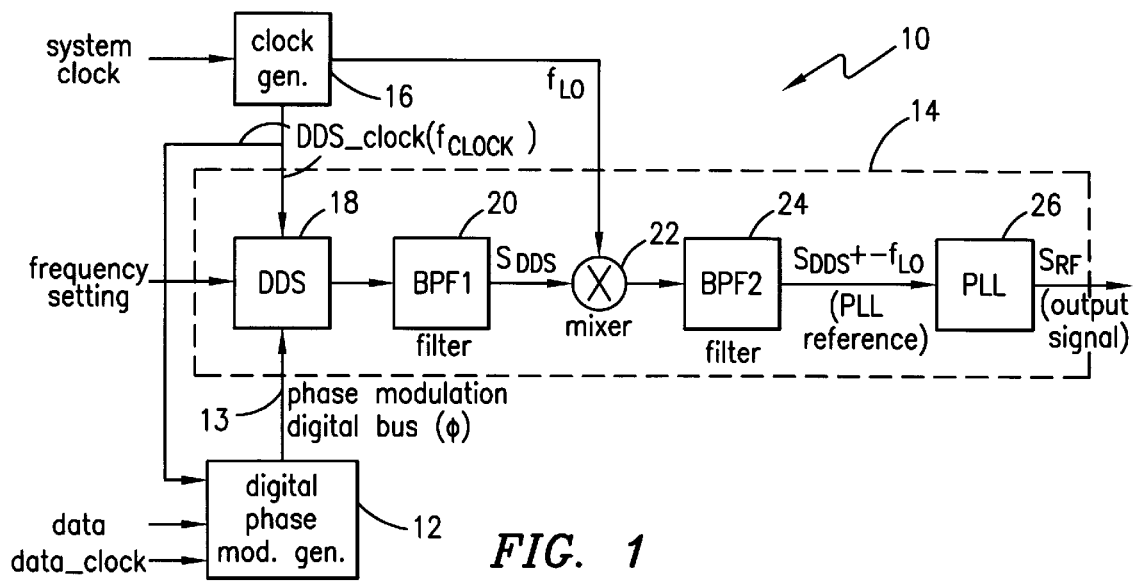
FIG. 1 is a schematic block diagram of a system that illustrates the use of a CPM generator with a DDS-driven PLL, and which can be used to implement the apparatus and method of the present invention.

FIG. 1 is a schematic block diagram of a system that illustrates the use of a CPM generator with a DDS-driven PLL, and which can be used to implement the apparatus and method of the present invention. In accordance with a preferred embodiment of the present invention, system 10 generally includes a CPM generator 12, a DDS-driven PLL 14, and a clock generator 16. The data (e.g., data or speech information) to be transmitted is converted by CPM generator 12 into a continuous, smoothly varying phase sequence, ø. The phase values in the sequence are quantized on a phase modulation bus 13 and correspond to actual locations between $-\pi$ and $\pi$ in the IQ plane. The phase of the converted signal will shift between only a limited number of phase states, which depends on the type of modulation used. In this embodiment, a GMSK modulation scheme is used. How the phase of the converted signal shifts between the different states is determined by a mathematical function. This mathematical function generates a limited number of phase trajectories that are stored in a memory location (e.g., in a memory associated with CPM generator 12). Depending on the data being input to CPM generator 12, a specific phase trajectory representing the input data is output on the phase modulation bus 13 and coupled to an input of a DDS 18.

The DDS-driven PLL 14 multiplies the signal spectrum on its reference input (from bus 13) with a division ratio, N. Consequently, the modulation signal spectrum generated by the DDS stage (18) should be reduced by the same factor. As such, the number of phase states in the IQ plane are increased or scaled by the factor, N. So, the corresponding phase trajectories stored in the memory associated with CPM generator 12 are also scaled by the factor, N, which decreases the modulation index, h, by the same factor (N).

DDS 18 modulates a first intermediate frequency signal, $F_{DDS}$, with the phase values input from bus 13. The signal, $F_{DDS}$, can be readily altered by loading a new digital control word in a phase accumulator in DDS 18, which advantageously enables a transmitter employing DDS-driven PLL 14 to effectuate fast frequency hopping in very small increments (e.g., smaller than 1 Hz).

The output signal from DDS 18 is bandpass filtered in filter 20 and can be mixed (as an option) by a mixer 22 with a local oscillator signal, $f_{LO}$, from a clock generator 16. The signal output from mixer 22 is bandpass filtered in filter 24, which passes one of the sidebands in the combined signal from mixer 22. The signal from bandpass filter 24 is used as the reference signal for the PLL stage 26 and upconverted with (or multiplied by) the division ratio, N. This reference signal contains the "downscaled" modulation signal spectrum, which is also multiplied by the ratio, N.

The frequency of the output signal, SRF, from PLL stage 26 is within the transmit frequency band, and can be expressed as:

$$S_{RF}=(f_{LO}\pm S_{DDS})\times N, \quad (1)$$

where N is the division ratio in the PLL. For this embodiment, exemplary values used can be $S_{DDS}$= 15.625–20.000 MHz, $f_{LO}$=100 MHz, and N=8, which results in a transmit output frequency band of $S_{RF}$=925–960 MHz (e.g., Extended GSM downlink band).

An important advantage of using system 10 and associated method as illustrated by FIG. 1 is that the frequency band at the output of DDS 18 can be kept narrow enough to exclude the harmonics. In other words, the higher frequency bound of the signal spectrum, $S_{DDS}$, can be less than twice its lower frequency bound, within the same time period as the higher bound is substantially lower than the clock generator signal, $f_{clock}$ (which is important in order to be able to exclude harmonic aliases in the DDS output band). Another important advantage of using system 10 and associated method is that any alteration of the modulation signal spectrum caused by the division ratio, N, can be corrected by the use of CPM generator 12 as shown.

More precisely, in the preferred embodiment, clock generator 16 in system 10 generates a DDS clock signal, which is a harmonic of the system clock signal and functions to lock the DDS clock frequency to the system clock frequency. Consequently, by making the DDS clock an integer multiple of the system clock, the hardware required for CPM generator 12 can be significantly reduced. Also, the same clock signal (or another harmonic of the system clock) can be output from clock generator 16 and used for the local oscillator frequency, $f_{LO}$, which can be mixed with the filtered DDS signal, $S_{DDS}$, to upconvert the DDS signal.

Figure 2:
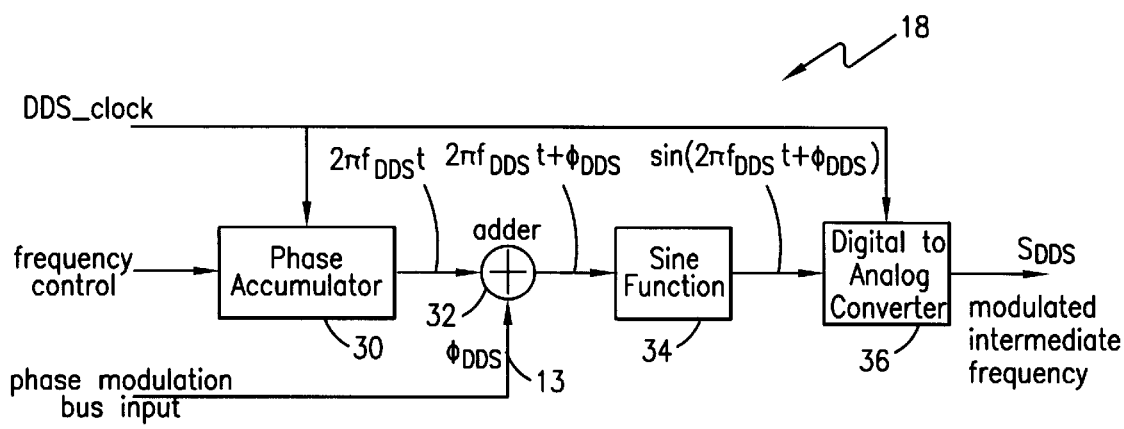
FIG. 2 is a schematic block diagram of an exemplary DDS that can be used to implement the apparatus and method of the present invention.

FIG. 2 is a schematic block diagram of an exemplary DDS (e.g., DDS 18 in FIG. 1), which can be used to implement the apparatus and method of the present invention. Specifically, a phase modulated signal, S, can be expressed as:

$$S_{DDS}=K\sin(2\pi f_{DDS}\emptyset+\phi_{DDS}), \quad (2)$$

where f represents the frequency of a signal, ø represents the information to be transmitted, and K is a constant. No amplitude information can be modulated on the resulting PLL output by the DDS reference signal. This makes the output a pure phase modulated signal without any amplitude variations, which is a significant advantage in comparing the present DDS-driven PLL transmitter with conventional transmitters employing an IQ modulator, or GMSK modulated DDS transmitters. The phase sequence of an analog signal, $f_{DDS}$, is created in a phase accumulator 30 (e.g., an unmodulated intermediate frequency signal). The frequency of ADDS can be digitally controlled by a constant that represents a desired output signal frequency. In this embodiment, phase accumulator 30 is a modulo $2^m$ adder (where m is the phase accumulator's buswidth) that functions to calculate a linear phase ramp. The phase of the ramp signal can be incremented in steps of a frequency control word each time the adder is clocked (e.g., at the DDS clock rate). The signal at the output of phase accumulator 30 represents angles between 0 and $2\pi$, and forms the first part ($2\pi f_{DDS}t$) of the sine argument in Equation 2.

The modulation data, $\phi_{DDS}$, is added to the phase value from phase accumulator 30 at adder 32 to form the argument of the sine function ($2\pi f_{DDS}t+\phi_{DDS}$). The resulting phase value is used as an address for a memory location in sine function table 34. The contents of an addressed memory location are output from sine function table 34 and coupled to a digital-to-analog converter (DAC) 36. As such, DDS 18 functions to implement Equation 2 using the phase modulation information, $\phi$, from CPM generator 12.

Returning to FIG. 1, the DAC (36) in DDS 18 generates several replicas of the fundamental signal being converted, so it is preferable to filter the output signal from the DDS with bandpass filter 20. Bandpass filter 20 also functions to reduce spurious frequency components in the DDS output signal.

Mixer 22 can be used (optionally) to convert the DDS output frequency band to a higher frequency band, in order to maintain a low loop division ratio, N, in the PLL. Mixer 22 generates both an upper and lower sideband. For this embodiment, use of the upper sideband is preferred in order to be able to keep the division ratio in the PLL as low as possible. Consequently, the signal output from mixer 22 is bandpass filtered in filter 24, in order to select the upper sideband for further processing, and also suppress intermodulation products.

Figure 3:
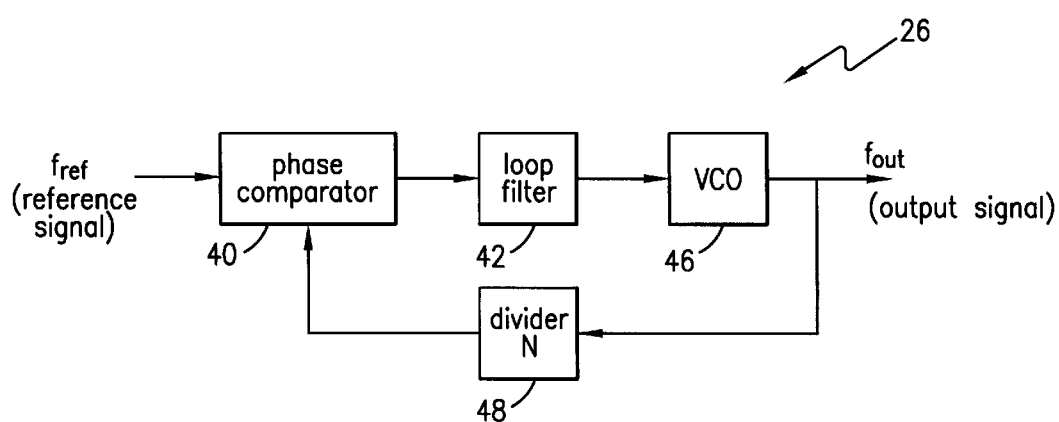
FIG. 3 is a schematic block diagram of an exemplary PLL that can be used to implement the apparatus and method of the present invention.

FIG. 3 is a schematic block diagram of an exemplary PLL (e.g., PLL 26 in FIG. 1), which can be used to implement the apparatus and method of the present invention. Specifically, PLL 26 functions as a frequency multiplier, which multiplies the reference input signal, $f_{ref}$, by the division ratio, N, and produces a high frequency signal (e.g., RF signal), $f_{out}$, at its output. The output signal from PLL 26 is thereby locked to the reference input signal.

The output signal, $f_{out}$, is generated by a voltage-controlled oscillator (VCO) 46, which is, in turn, controlled by the regulating loop of the PLL. The control voltage at the input of VCO 46 (from the output of loop filter 42) comprises a lowpass-filtered version of the difference between the reference signal, $f_{ref}$, and the output signal, $f_{out}$, divided by N (48). Consequently, the output signal from PLL 26 is: $f_{out}=N*f_{ref}$. The lowpass loop filter (42) in the PLL suppresses unwanted signals close in frequency to the desired DDS reference, which is important in order to be able to meet the stringent requirements imposed on cellular systems.

A potential problem can occur if the reference signal, $f_{ref}$, is modulated, because the modulation spectrum (bandwidth) will be expanded by the factor, N. In order to compensate, the reference signal, $f_{ref}$, has a modulation index that is divided by N, so that the resulting modulation spectrum (bandwidth) output from the PLL has the original modulation index.

Figure 4:
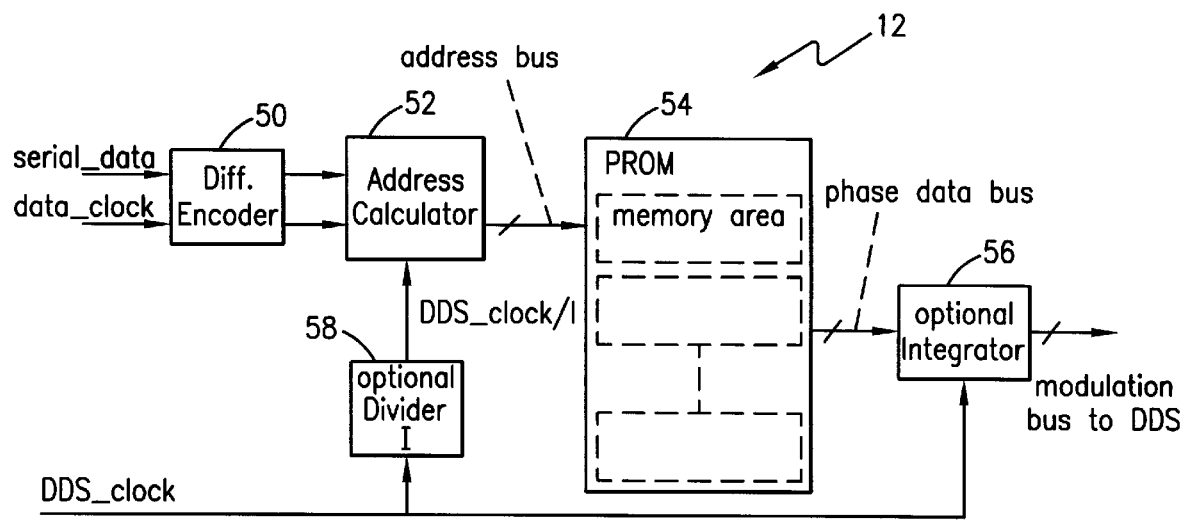
FIG. 4 is a schematic block diagram of an exemplary CPM generator that can be used to implement the apparatus and method of the present invention.

FIG. 4 is a schematic block diagram of an exemplary CPM generator (e.g., digital CPM generator 12 in FIG. 1), which can be used to implement the apparatus and method of the present invention. Essentially, CPM generator 12 functions to transform the incoming information (to be transmitted) to a smooth, changing phase sequence. The output signal from CPM generator 12 is coupled via the modulation bus 13 to the modulation input of DDS 18. Basically, information symbols are transmitted as changes in the phase of the transmitted carrier. Since the PLL (26) functions to multiply the signal spectrum appearing at its input, CPM generator 12 takes this PLL function into account. The transition between the phase angles in the signal to be transmitted are predetermined by the history of incoming data, a function that depends on the modulation scheme used, and the division ratio, N, of the PLL. The number of possible phase states on the output bus of the PLL is N times the number of states in the IQ plane of the chosen modulation scheme.

The phase of the signal to be transmitted can be expressed as $\phi(t,\alpha)$ and represents the actual phase of the transmitter's output. This signal contains the information to be transmitted, which, in turn, depends on the data vector, $\alpha$, and the time, t. Any phase modulated signal can be described by an expansion of Equation 2, and expressed as:

$$S_{RF}(t,\alpha) = \sqrt{\frac{2E}{T}} \sin(2\pi ft + \phi(t,\alpha)), \quad (3)$$

where T is the symbol time (1/information rate), and E is the energy in one symbol. Since the energy, E, and symbol time, T, are constant, they can be understood but omitted from the following discussion. The data vector, $\alpha_k$, can comprise M symbols (M is even). In a binary system, M=2, which means that the data symbols are +1 and −1. The data vector can be expressed as:

$$\alpha_k \in \pm \quad (4)$$

For this embodiment, the phase equation for a CPM scheme can be expressed as:

$$\phi(t,\alpha) = 2\pi \frac{h}{n} \sum_{k=-\infty}^{\infty} \alpha_k q(t-kT) + \psi_0. \quad (5)$$

The function, q(t), in Equation 5 represents the phase smoothing response (a filter function) that smooths out the resulting phase trajectory between two phase states. The expression, $\psi_0$, represents the initial phase, which is preferably set to zero. The modulation index, h, and the PLL division ratio, N, determine how much the phase is allowed to change. The phase pulse is zero for t<0, and constant for t>LT, where L is the correlation length (the length of the bit history taken into account). Accordingly, Equation 5 can be expanded and expressed as:

$$\phi(t,\alpha_k) = 2\pi \frac{h}{N} \alpha_k q(t-kT) + 2\pi \frac{h}{N} \sum_{i=k-L+1}^{k-1} \alpha_i q(t-iT) + \theta. \quad (6)$$

The phase state depends on all data bits older than L, and changes in steps of $h\pi/N$. The expression, $\theta$, in Equation 6 is the state vector that represents the phase state that is "updated" each symbol interval T. The phase state described by Equation 6 "remembers" the bit history and thus keeps the output phase (from the CPM modulator) continuous. The phase state can be expressed as:

$$\theta = \pi \frac{h}{N} \sum_{i=0}^{k-L} \alpha_i. \quad (7)$$

This part of the CPM phase equation has the greatest impact on the hardware used to implement the CPM generator, when the PLL division ratio, N, is a higher number, since more phase trajectories have to be stored in memory. Notably, for this embodiment, an important consideration when calculating the phase trajectories is that they should be continuous at the ends of the interval, $-\pi$ to $\pi$. Consequently, the summation in Equation 7 should be in modulo $2\pi$ and so implemented in the CPM generator hardware.

Returning to FIG. 4, an exemplary topology for a CPM generator is shown. In this embodiment, CPM generator 12 includes an address calculator 52 and a memory section 54. For example, memory section 54 can be a programmable read-only-memory (PROM). Address calculator 52 provides a capability of implementing numerous CPM schemes with different correlation lengths (L) and PLL division ratios (N). The incoming serial data is differentially encoded by encoder 50 (as an option), and transformed to an address sequence by address calculator 52. The resulting address sequence corresponds to a specific phase trajectory stored in memory section 54. The phase trajectories corresponding to the addressed sequences are output on a phase data bus, with a rate equal to the data_clock signal multiplied by R. The expression, R, represents the number of samples per phase trajectory.

The clock rate can be reduced with the integration factor, I, in order to save memory space. The phase data rate is equal to the DDS_clock rate/I prior to reaching the optional integrator 56, and can be increased to the DDS_clock rate, by multiplying it with I in integrator 56. Consequently, the phase data rate at the CPM generator output can be the same as the internal rate in the DDS. For this embodiment, the optimal memory space used in memory section 54 is equal to 32NR/I words. This can be reduced further due to the symmetrical nature of the trajectories, but it would, in that case, require more hardware in the address calculator.

Figure 5:
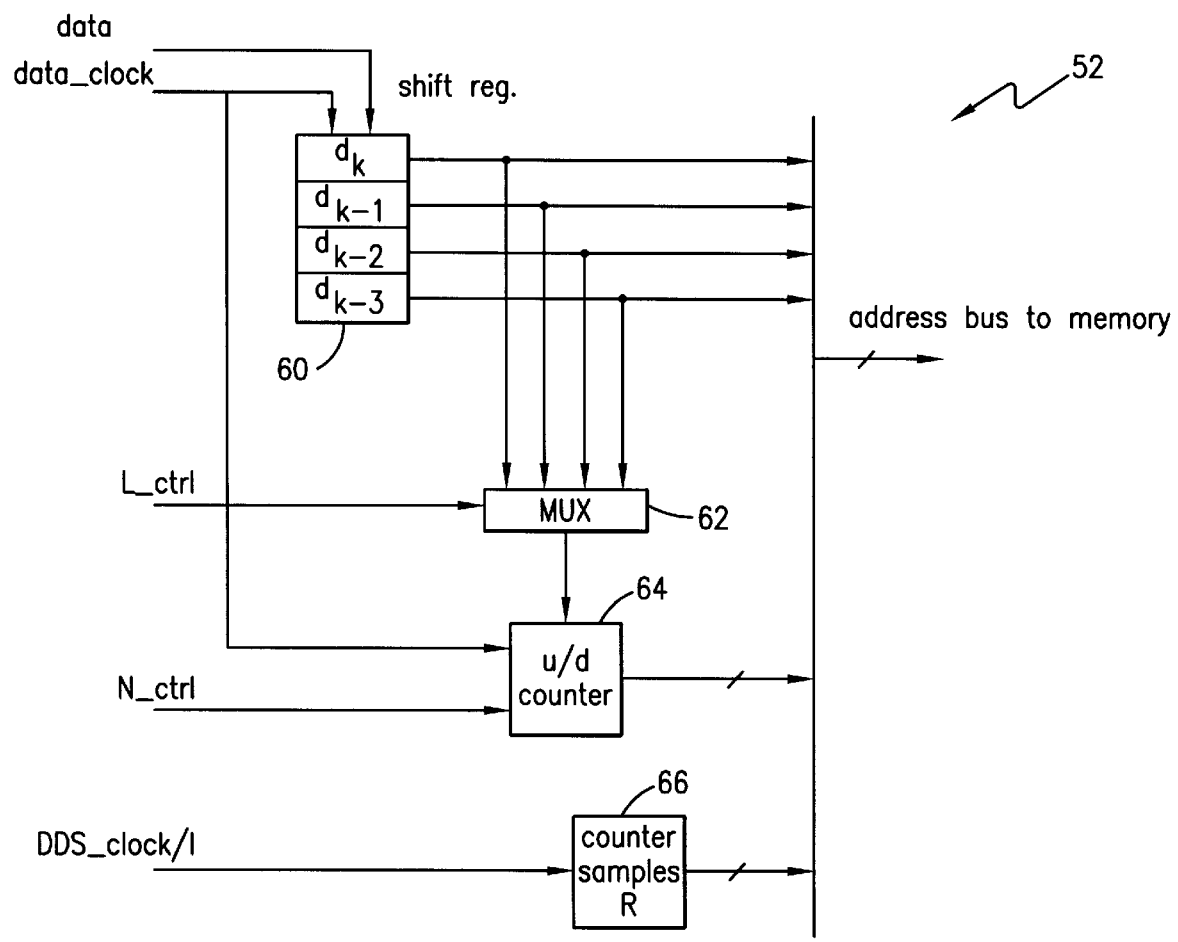
FIG. 5 is a schematic block diagram of an exemplary address calculator that can be used to implement the apparatus and method of the present invention.

FIG. 5 is a schematic block diagram of an exemplary address calculator (e.g., address calculator 52 in FIG. 4), which can be used to implement the apparatus and method of the present invention. Address calculator 52 functions to calculate which phase trajectory corresponds to a specific combination of incoming data bits and their history. For this embodiment, address calculator 52 functions to implement Equations 6 and 7 above. For example, the incoming data are shifted into register 60. By inputting an L_control word to multiplexer 62, the correlation length, L, of the incoming data bits can be adjusted to an appropriate length by controlling the number of bits that are shifted out of register 60. By inputting an N-control word to an up/down counter 64, the loop division ratio, N, can be compensated for, also by controlling the number of bits shifted out of register 60. Additionally, by inputting a DDS_clock/I control word to sample counter 66, the number of samples (R) made of the phase trajectory can be controlled. The address sequence calculated by address calculator 52 is input to memory section 54, which stores the corresponding phase trajectory that is output to the DDS (18).

Figure 6B:
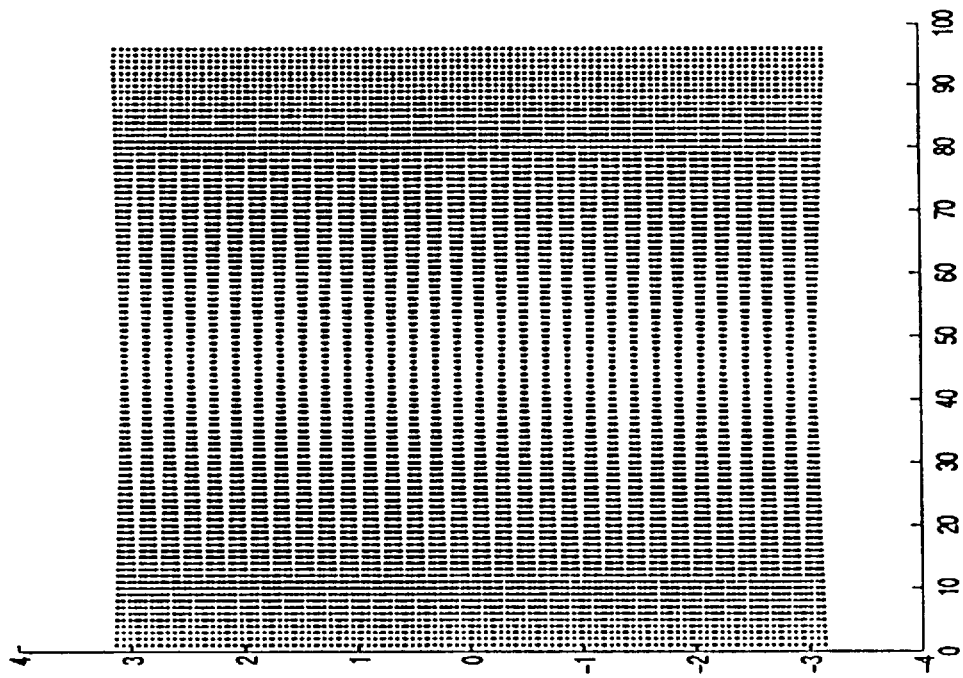
FIG. 6B is a diagram that illustrates the memory contents of memory section 54 in FIG. 4 for a DDS-driven PLL transmitter, in accordance with the present invention.
Figure 6A:
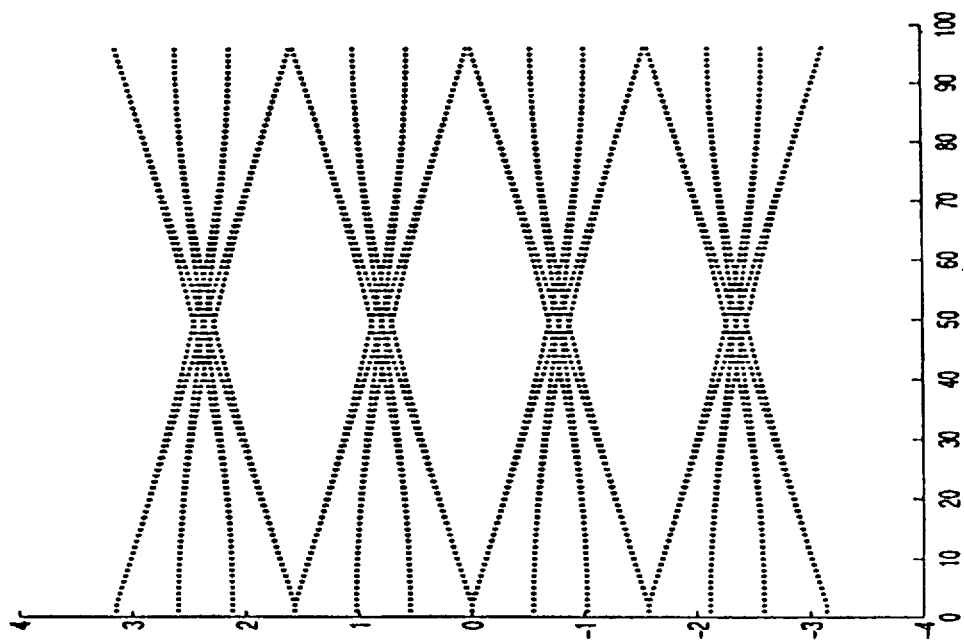
FIG. 6A is a diagram that illustrates the memory contents of a memory section for a conventional GMSK DDS transmitter without a multiplying upconversion stage.

FIG. 6A is a diagram that illustrates the memory contents of a memory section for a conventional GMSK DDS transmitter without a multiplying upconversion stage. FIG. 6B is a diagram that illustrates the memory contents (phase trajectory) of memory section 54 in FIG. 4 for a DDS-driven PLL transmitter, in accordance with the present invention. FIG. 6C is a diagram that illustrates the phase states for the transmitter of FIGURE 6A, and FIG. 6D is a diagram that illustrates the phase states for the DDS-driven PLL transmitter of FIG. 6B.

Referring to FIGS. 6A and 6C, the diagrams show the memory contents in a memory section and associated phase states, respectively, for a specific solution where GMSK is implemented with a PLL division ratio of N=1 (e.g., without compensating for the division ratio). FIGS. 6B and 6D show the memory contents of memory section 54 and associated phase states, respectively, for a specific solution, but where GMSK is implemented with a PLL division ratio of N=8 and the division ratio is compensated for, in accordance with the present invention.

For this embodiment, the CPM variant of GMSK has the following parameters: (1) the phase smoothing response, q(t), is a Gaussian pulse; (2) the correlation length, L=3; and (3) the modulation index, h=0.5. The phase smoothing response in Equations 5 and 6, along with the correlation length (L), modulation index (h), symbol time (T), and PLL division ratio (N) determine the memory contents of an addressed location in memory section 54 (e.g., as shown in FIGS. 6B and 6D).

FIG. 7 is a schematic block diagram of an exemplary transmitter stage, which can be used to implement the apparatus and method of the present invention. Generally, the continuous phase modulated, DDS-driven PLL shown in and described above with respect to FIG. 1 can be used for the components denoted by numeral 10 in FIG. 7. The RF output signal from PLL 26 is coupled to a power control and amplifier stage 27, and then transmitted from antenna 29 As shown in FIG. 7, the continuous phase modulated, DDS-driven PLL and transmitter output stage can be implemented in a cellular network radio transmitter (e.g., in either a base station or mobile station), or any transmitter that uses a digital modulation scheme.

Figure 8:
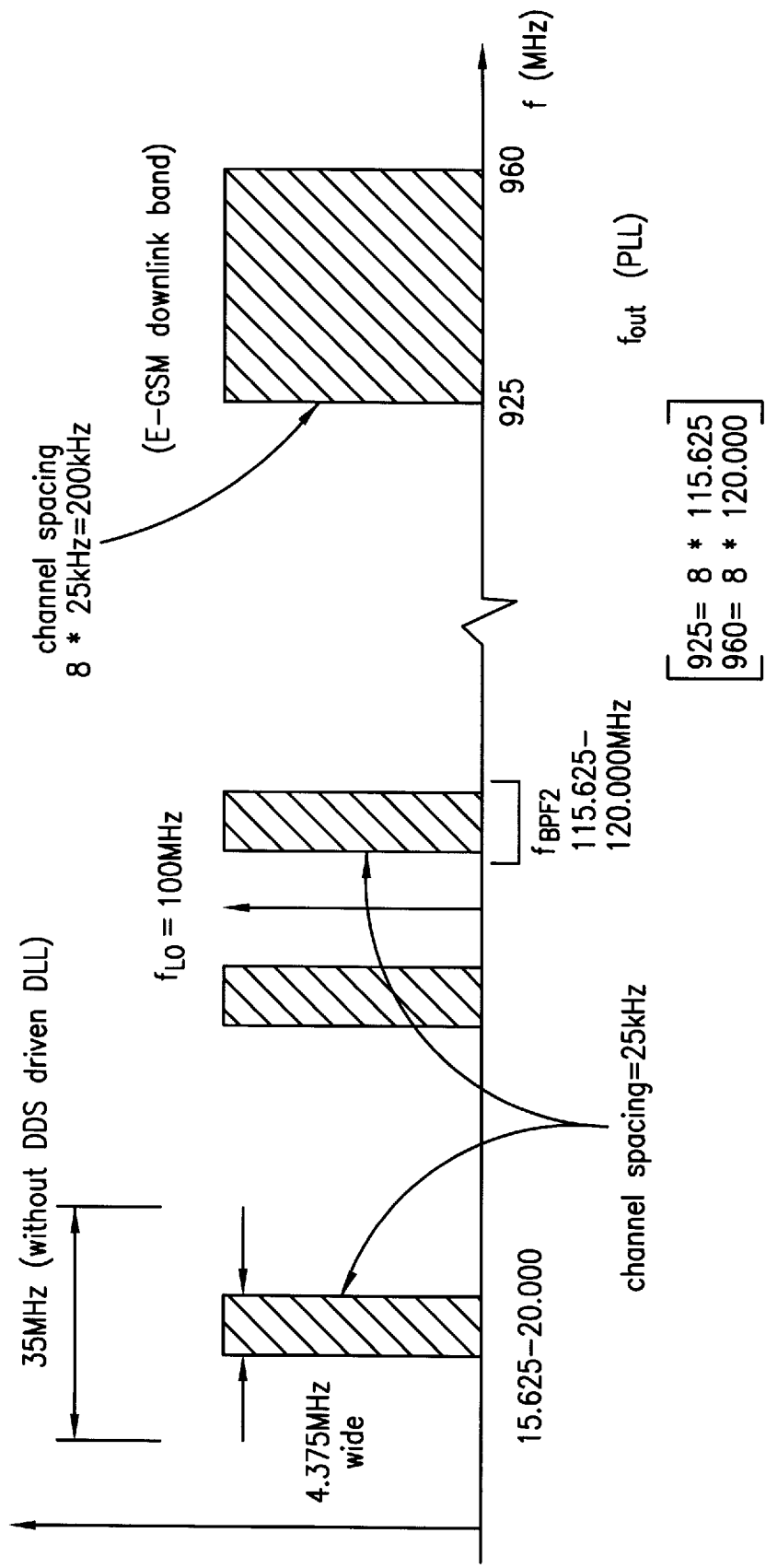
FIG. 8 is a diagram that illustrates certain signals generated by discrete components in the continuous phase modulated, DDS-driven PLL systems shown in FIGS. 1 and 7.

FIG. 8 is a diagram that illustrates certain signals generated by discrete components in the continuous phase modulated, DDS-driven PLL systems shown in FIGS. 1 and 7. In the preferred embodiment, as shown, the PLL division ratio, N, being used is 8, and the channel spacing in the DDS output being used is about 25 kHz, which will increase 8 times to about 200 kHz after the PLL. As a consequence of using the systems and methods illustrated by FIGS. 1 and 7, the output signal spectrum, $f_{DDS}$, from DDS 18 is about 4.375 MHz wide. The output sidebands from mixer 22 are also about 4.375 MHz wide. The output spectrum from the PLL (26) is 8 times wider (about 35 MHz). On the other hand, for a conventional system that does not use a continuous phase modulated, DDS-driven PLL for an upconversion stage, the output spectrum of a DDS used in such a system would be about 35 MHz wide. As such, the frequency band of the DDS output in the present CPM DDS-driven PLL embodiment is significantly narrower than the frequency band of upconversion stages used in conventional transmitters (e.g., without DDS-driven PLLs), and therefore, there are significantly less spurious emissions in the transmitted signal. However, a transmitter employing the present phase-modulated DDS-driven PLL topology can still transmit over a relatively wide frequency band.

Although a preferred embodiment of the method and apparatus of the present invention has been illustrated in the accompanying Drawings and described in the foregoing Detailed Description, it will be understood that the invention is not limited to the embodiment(s) disclosed, but is capable of numerous rearrangements, modifications and substitutions without departing from the spirit of the invention as set forth and defined by the following claims.

What is claimed is:

1. A transmitter for use in a communication system, comprising:
    a digital synthesizer:
    a phase locked loop, an output of said digital synthesizer coupled to an input of said phase locked loop;
    a phase modulation generator, an output of said phase modulation generator coupled to an input of said digital synthesizer such that said phase modulation generator phase modulates a signal at said output of said digital synthesizer; and
    wherein said phase modulation generator comprises a phase modulation generator means for generating a plurality of phase trajectory signals at said output of said phase modulation generator, said plurality of phase trajectory signals associated with information to be transmitted by said transmitter.

2. The transmitter of claim 1, wherein a division ratio for said phase locked loop is N, and a scaling factor for said plurality of phase trajectory signals is N.

3. The transmitter of claim 1, wherein said phase modulation generator comprises a continuous phase modulation generator.

4. A method for modulating an output signal from a phase locked loop in a radio transmitter, comprising the steps of:

generating signals for supplying a digital synthesizer with a plurality of phase trajectory signals that are associated with information to be transmitted by said radio transmitter;

modulating a signal at an output of said digital synthesizer with said plurality of phase trajectory signals; and coupling said modulated signal at said output of said digital synthesizer to an input of said phase locked loop, and thereby modulating said output signal from said phase locked loop.

5. The method of claim 4, wherein said plurality of phase trajectory signals comprises a continuous phase modulation signal.

6. The method of claim 4, wherein a division ratio for said phase locked loop is N, and a scaling factor for said plurality of phase trajectory signal is N.

7. A transmitter for use in a communication system, comprising:

a digital synthesizer;

a phase locked loop, an output of said digital synthesizer coupled to an input of said phase locked loop a phase modulation generator, an output of said phase modulation generator coupled to an input of said digital synthesizer such that said phase modulation generator phase modulates a signal at said output of said digital synthesizer; and wherein said phase modulation generator is adapted to accommodate a division ratio of N of said phase locked loop.

8. The transmitter of claim 7, wherein said phase modulation generator is adapted so that phase trajectories stored therein are scaled by N.

9. The transmitter of claim 7, wherein said output of said digital synthesizer contains a modulation signal spectrum that is downscaled by N.

10. The transmitter of claim 7, wherein said phase modulation generator is adapted so that transitions between phase angles in a signal to be transmitted are predetermined, at least in part, by said division ratio of N of said phase locked loop.

11. The transmitter of claim 7, wherein said phase modulation generator is adapted by including a memory, sail memory having an amount of storage that is substantially proportional to said division ratio of N of said phase locked loop.

12. The transmitter of claim 7, wherein said phase modulation generator is adapted by including an address calculator, said address calculator including a circuit: element for receiving an N-control word.

13. The transmitter of claim 12, wherein said circuit, element for receiving an N-control word is an up/down counter for compensating for said division ratio of N of said phase locked loop.

14. The transmitter of claim 7, wherein said phase modulation generator generates a plurality of phase trajectory signals at said output of said phase modulation generator, said plurality of phase trajectory signals associated with information to be transmitted by said transmitter, and wherein said phase modulation generator is adapted such that a scaling factor for said plurality of phase trajectory signals is N.

* * * * *

UNITED STATES PATENT AND TRADEMARK OFFICE
CERTIFICATE OF CORRECTION

PATENT NO. : 5,834,985
DATED : November 10, 1998
INVENTOR(S) : Sundergård

Page 1 of 1

It is certified that error appears in the above-identified patent and that said Letters Patent is hereby corrected as shown below:

<u>Column 9,</u>
Line 16, please replace "signal" with -- signals --.

<u>Column 10,</u>
Line 11, please replace "sail" with -- said --.

Signed and Sealed this

Twenty-third Day of October, 2001

Attest:

NICHOLAS P. GODICI
Attesting Officer
Acting Director of the United States Patent and Trademark Office